United States Patent
Ohgiyama et al.

(10) Patent No.: US 6,372,546 B2
(45) Date of Patent: Apr. 16, 2002

(54) METHOD OF PRODUCING SEMICONDUCTOR DEVICE AND CONFIGURATION THEREOF, AND LEAD FRAME USED IN SAID METHOD

(75) Inventors: Kenji Ohgiyama; Teruhisa Fujihara; Tamotsu Ueda, all of Isahaya (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/828,132

(22) Filed: Apr. 9, 2001

Related U.S. Application Data

(62) Division of application No. 09/234,321, filed on Jan. 21, 1999, now Pat. No. 6,252,306.

(30) Foreign Application Priority Data

May 12, 1998 (JP) ............................................ 10-128896

(51) Int. Cl.[7] ......................... H01L 21/44; H01L 21/48; H01L 21/50
(52) U.S. Cl. ...................... 438/111; 438/112; 438/123; 438/127
(58) Field of Search ................................ 438/111, 112, 438/123, 127

(56) References Cited

U.S. PATENT DOCUMENTS

| | | | |
|---|---|---|---|
| 5,157,475 A | * | 10/1992 | Yamaguchi |
| 5,442,228 A | * | 8/1995 | Pham et al. |
| 5,614,441 A | * | 3/1997 | Hosokawa et al. |
| 5,900,676 A | * | 5/1999 | Kweon et al. |
| 5,973,388 A | * | 10/1999 | Chew et al. |
| 5,977,613 A | * | 11/1999 | Takata et al. |
| 6,025,640 A | * | 2/2000 | Yagi et al. |
| 6,107,676 A | * | 8/2000 | Suzuki |

* cited by examiner

Primary Examiner—John F. Niebling
Assistant Examiner—Josetta I. Jones
(74) Attorney, Agent, or Firm—Oblon, Spivak, McClelland, Maier & Neustadt, P.C.

(57) ABSTRACT

Providing a method of producing a semiconductor device wherein semiconductor element are sealed with a resin by using the same lead and other means regardless of the specifications of the semiconductor elements, and a semiconductor device which can be reduced in size and weight and has good heat dissipation performance and high-frequency performance.

The semiconductor devices can be produced by mounting a plurality of the semiconductor elements on the lead frame having leads disposed substantially parallel to each other, sealing the whole with a resin, and cutting off the individual semiconductor devices.

7 Claims, 15 Drawing Sheets

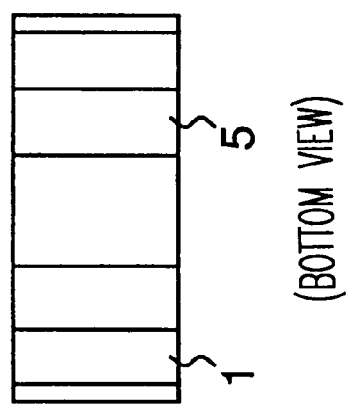
Fig.1C (BOTTOM VIEW)
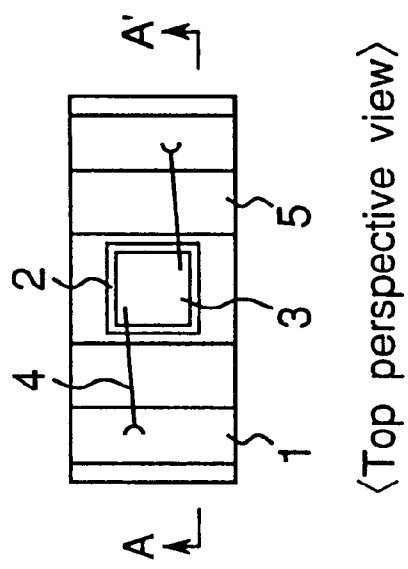
Fig.1B ⟨Top perspective view⟩
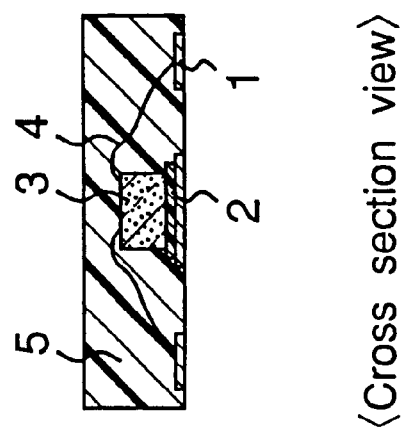
Fig.1A ⟨Cross section view⟩

⟨Cross sectional view⟩ ⟨Top view⟩

Die bonding step

⟨Cross sectional view⟩ ⟨Top view⟩

Wire bonding step

⟨Cross sectional view⟩ ⟨Top view⟩

⟨Side view⟩

⟨Top perspective view⟩

⟨Side view⟩

⟨Top perspective view⟩

⟨Side view⟩

⟨Top perspective view⟩

⟨Side view⟩

⟨Bottom view⟩

⟨Direction of side view 2⟩
⟨Direction of side view 1⟩
⟨Top perspective view⟩

⟨Side view 2⟩

⟨State of solder paste transferred⟩

⟨Side view 1⟩

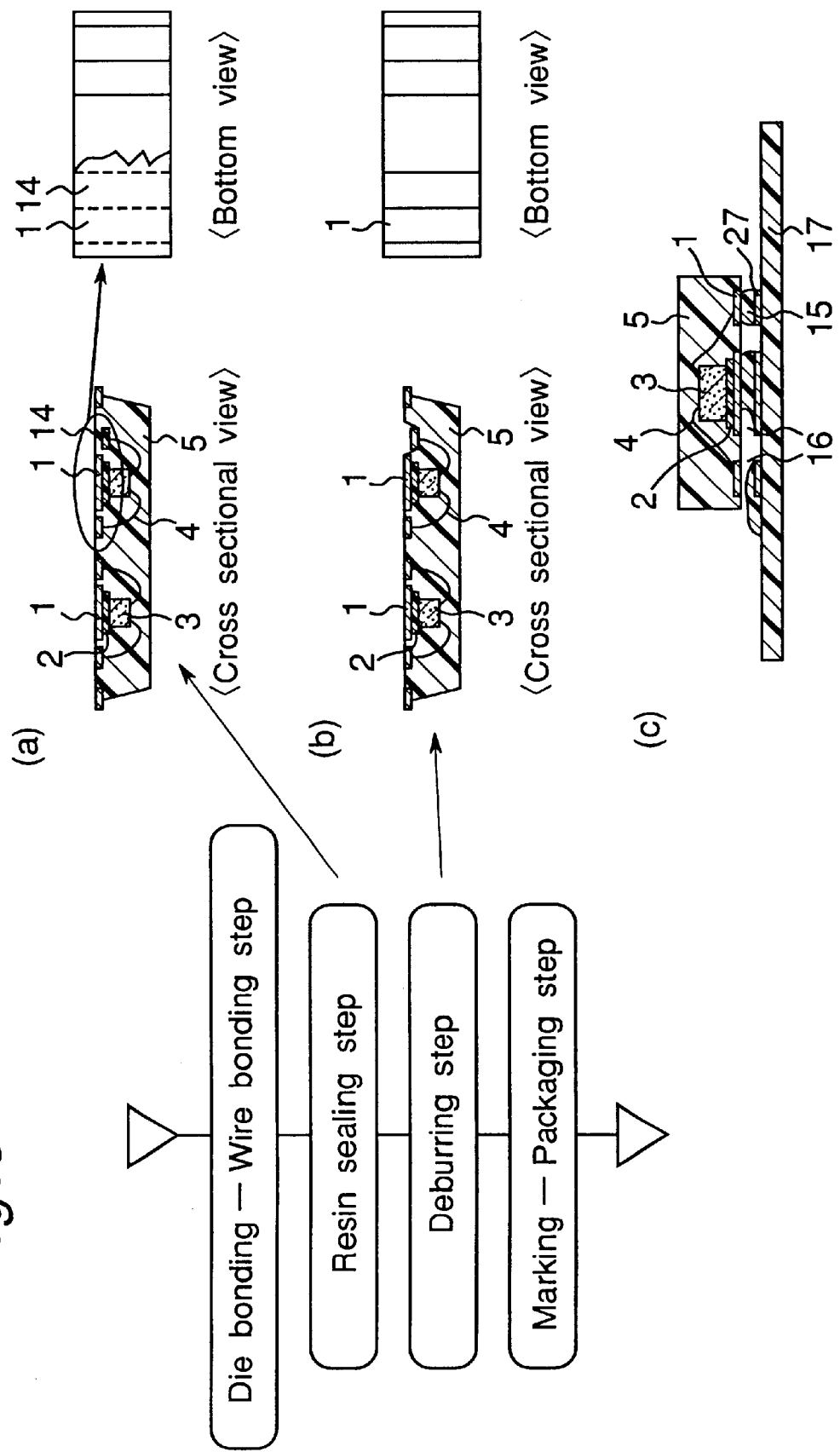

⟨Semiconductors attached to a sheet⟩

⟨Cross sectional view⟩

⟨Top perspective view⟩

⟨Cross sectional view⟩

⟨Top perspective view⟩

⟨Bottom view⟩

⟨Cross sectional view⟩

⟨Top perspective view⟩

⟨Top perspective view⟩

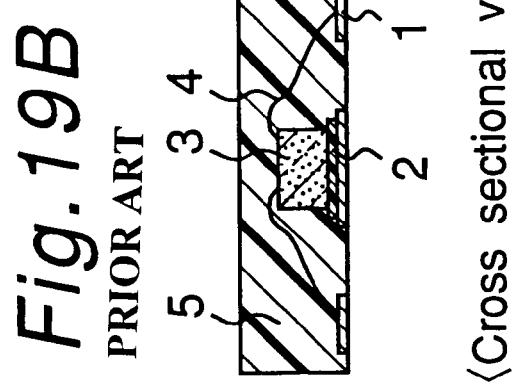
*Fig.19B* PRIOR ART ⟨Cross sectional view⟩
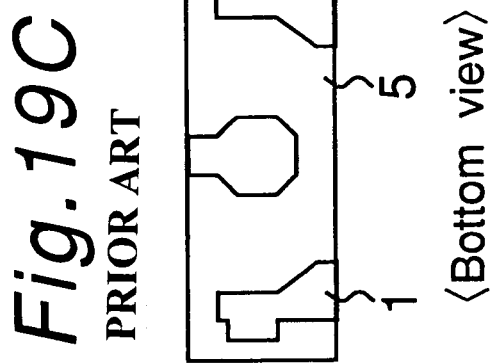
*Fig.19C* PRIOR ART ⟨Bottom view⟩
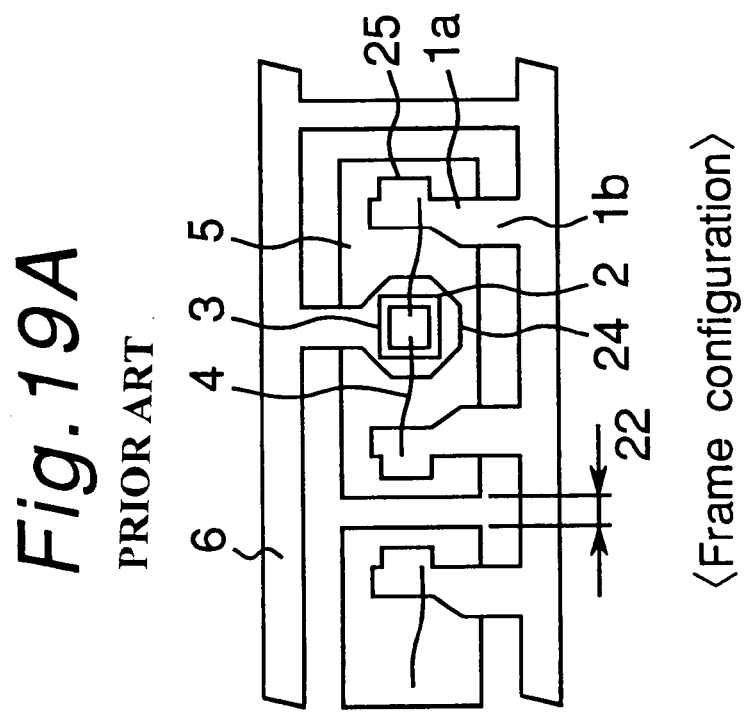
*Fig.19A* PRIOR ART ⟨Frame configuration⟩

⟨State of solder paste transferred⟩

⟨Top perspective view⟩

⟨Side view 1⟩

⟨Side view 2⟩

METHOD OF PRODUCING SEMICONDUCTOR DEVICE AND CONFIGURATION THEREOF, AND LEAD FRAME USED IN SAID METHOD

CROSS REFERENCE TO RELATED APPLICATION

The present document claims is a Divisional of the earlier filing date of co-pending U.S. patent application Ser. No. 09/234,321, entitled "METHOD OF PRODUCING SEMICONDUCTOR DEVICE AND CONFIGURATION THEREOF, AND LEAD FRAME USED IN SAID METHOD" filed in the U.S. Patent and Trademark Office on Jan. 21, 1999, and claims priority to Japanese Application No. 10-128896 filed May 12, 1998, the entire contents of both of which being incorporated herein by reference.

BACKGROUND OF THE INVENTION

1. Field of the Invention

The present invention relates to a method of producing a semiconductor device and a configuration thereof. More particularly, it relates to a method of producing a resin-sealed semiconductor device and a configuration thereof which make it possible to decrease the size, thickness, weight and cost of the device.

2. Description of the Related Art

FIGS. 15A and 15B show a gull-wing type semiconductor device with the configuration of the prior art, FIG. 15A being a cross sectional view thereof and FIG. 15B being a top view thereof.

A semiconductor device of this configuration is generally produced in such steps as shown in FIG. 16, in a procedure described below. A semiconductor element 3 is bonded by means of a die bonding material 2 on an island 24 of a lead frame 6 which has the islands 24 and leads 1 as shown in FIG. 17. Then after connecting an inner lead section of the lead 1 surrounding the island 24 to an electrode pad located on the semiconductor element 3 by wire bonding using a wire 4 such as gold wire, the elements are sealed individually on both sides of the lead frame 6 by using a sealing resin 5. FIG. 18 is a top view of the semiconductor device with the configuration of the prior art after being sealed with resin. In a last stage, an outer lead section of the lead 1 is plated with tin or the like, cut off from the lead frame 6 and formed in gull wing shape, thereby to obtain the semiconductor device as shown in FIGS. 15A and 15B.

In the production method of the prior art, it is necessary to prepare the lead frame 6 having the islands 24 matched to the size of the semiconductor elements 3 and molding dies (not shown) for sealing the individual semiconductor elements with a resin. Therefore, when semiconductor elements 3 of different specifications are used, it is necessary to prepare different lead frames 6 and different molding dies for the various specifications.

In the semiconductor device of the prior art shown in FIGS. 15A and 15B, there has been a limitation on the reduction of the size and weight because the resin covers both sides of the lead frame 6.

Moreover, because heat generated by the semiconductor element 3 is dissipated through the lead 6, it is difficult to apply the device to high-output power transistors which generated much heat. Because of the relatively long connection between the semiconductor element 3 and a mother board, it is also difficult to apply the device to high-frequency transistors or the like.

To counter such problems as described above, a molded transistor having only one side of a lead being molded with a resin is disclosed, for example, in Japanese Patent Kokai Publication No. 62-134945. However, since production of such a molded transistor requires different lead frames for different specifications as in the prior art and molding with the resin is carried out individually for each semiconductor element, different molding dies must be prepared according to different specifications and therefore the above problems are not solved.

Also the devices are mounted on the mother board by using flat leads according to this prior art technology, but it cannot be applied to devices which generate much heat because of relatively small lead area.

SUMMARY OF THE INVENTION

An object of the present invention is to provide a method of producing the semiconductor device wherein semiconductor element are sealed with resin by using the same lead and independent of the specifications of the semiconductor elements, and a semiconductor device which can be reduced in size and weight and has good heat dissipation performance and high-frequency performance.

The present inventors have intensively studied. As a result, they found that semiconductor devices can be produced with a same lead frame regardless of the specifications of semiconductor elements when a plurality of the semiconductor elements are mounted on the lead frame having leads disposed substantially parallel to each other and, after sealing the whole with a resin, the individual semiconductor devices are cut off, and that the semiconductor device has improved heat dissipation performance and high-frequency performance. Thus, the present invention has been accomplished.

The present invention provides a method of producing a semiconductor device comprising a die bond pad, a wire bond pad, a semiconductor element mounted on the die bond pad, and a sealing resin for molding the semiconductor element, which comprises preparing a lead frame having a plurality of leads disposed substantially in parallel to each other at intervals in the longitudinal direction in the same plane; bonding a plurality of semiconductor elements in parallel on at least one lead surface of the lead frame; electrically connecting an electrode of each semiconductor element and another lead adjacent therewith in the longitudinal direction; molding the plurality of semiconductor elements together by means of the sealing resin applied from above the lead surface so that the back side of the lead is exposed; and cutting the lead and the sealing resin in the longitudinal direction between the semiconductor elements, thereby to take the lead with the semiconductor element being mounted thereon as a die bond pad, and to take the lead connected to the electrode of the semiconductor element as a wire bond pad.

With this method of producing the semiconductor element, because it is not necessary to prepare a plurality of lead frames for different sizes of the semiconductor elements to be mounted, the lead frame can be used in common, and therefore it becomes possible to simplify the production process and reduce the production cost.

Particularly with this method, since the semiconductor devices are made by cutting off the lead frame whereon the semiconductor elements are bonded consecutively, no part of the lead frame will be wasted, so that product yield per unit area of the lead frame is improved and the production cost can be reduced.

The present invention also provides a method of producing the semiconductor device, wherein the back surface of the lead is covered with a resin sheet thereby to mold with the sealing resin.

By providing such a step, the sealing resin is prevented from seeping through the space between the leads to the back surface of the lead during the sealing step, thus making it possible to prevent connection failure from occurring when connecting the semiconductor device to the mother board.

The resin sheet may be applied either to the entire back surface of the lead or to a part thereof.

Alternatively, the space between the leads may be filled with a masking material before applying the sealing resin.

Seeping of the sealing resin to the back of the leads can be prevented by filling the space between the leads with the masking material.

The present invention also provides a method of producing the semiconductor device, wherein the sealing resin which has seeped to the back surface of the lead is removed after applying the sealing resin.

By providing such a step, connection failure due to the sealing resin seeping to the back surface of the lead can be prevented.

The present invention also provides a method of producing the semiconductor device, wherein the leads are supplied in the form of a lead frame having electrically conductive leads fastened onto a frame substantially in parallel to each other at intervals in the same plane.

By using the lead frame having leads disposed parallel to each other, handling of the leads during the production process is made easier.

The size of the lead in the longitudinal direction whereon the semiconductor element is mounted is preferably equal to or less than the size of the semiconductor element in the longitudinal direction.

When the space between the leads is made equal to or less than the width of the semiconductor element, distance between the leads can be made larger even when the semiconductor device is made smaller, thus making it possible to prevent short circuit between the leads when connecting the semiconductor device to the mother board.

The semiconductor element may also be bonded on the lead surface by means of an electrically conductive or adhesive insulator.

When an electrically conductive resin is used, the semiconductor element and the die bond pad can be electrically connected.

The present invention also provides a method of producing the semiconductor device, wherein the sealing resin is cut off outside a plurality of semiconductor elements so that the plurality of semiconductor elements bonded on the different leads which are arranged in a direction perpendicular to the leads are molded in the same sealing resin.

By employing this method, it is made possible to easily produce the arrayed semiconductor device where the plurality of semiconductor elements are molded together in the sealing resin.

The present invention also provides a lead frame comprising a plurality of leads arranged substantially in parallel to each other in the longitudinal direction at intervals in the same plane.

The present invention also provides a semiconductor device comprising a die bond pad with a semiconductor element mounted on the top surface thereof; a wire bond pad arranged substantially in parallel to each other in the longitudinal direction while interposing the die bond pads therebetween; and a sealing resin for molding the semiconductor elements; wherein the sealing resin is applied from above the die bond pads and the wire bond pads so that the back surfaces of the die bond pads and the wire bond pads are exposed, while the space between the die bond pads and the wire bond pads is also filled with the sealing resin.

In a semiconductor device of such a configuration as described above, only the surface of the semiconductor device is sealed with the resin while the die bond pads and the wire bond pads formed by cutting off the leads are exposed on the back surface, and therefore it is made possible to connect the semiconductor device directly to the mother board by using the back surface of the semiconductor device, thus contributing to the reduction in the mounting area and height, size and weight of the device.

Also because the die bond pads and the wire bond pads are directly connected to the mother board, heat dissipation from the semiconductor element is improved so that the present invention can be applied to high output power elements, which generate much heat, as well.

Also because the distance of connecting the mother board and the semiconductor element can be reduced, good high-frequency characteristics can be obtained even when a high-frequency element is used for the semiconductor element.

Also bonding area for bonding the semiconductor device onto the mother board with solder or the like by using the die bond pads and the wire bond pads is increased, thus making it possible to increase the bonding strength.

The die bond pads and the wire bond pads are preferably provided to lie across both sides of the semiconductor device in the lateral direction of the semiconductor device.

By employing this configuration, areas of the die bond pads and the wire bond pads on back of the semiconductor device can be increased, thus making it possible to improve the heat dissipation and increase the bonding strength.

The space between the die bond pads and the wire bond pads may also be filled with a masking material instead of the sealing resin.

By using the masking material, it is made possible to prevent the sealing resin from seeping to the back of the leads.

The die bond pads and/or the wire bond pads preferably have a plurality of recesses on the top and/or the bottom surfaces.

By making recesses in the leads, contact area with the sealing resin applied thereon or with the solder used for connection to the mother board is increased, thus increasing the bonding strength and improving the reliability of the semiconductor device.

Also because the section area of the lead can be decreased with this configuration, cutting area during dicing is decreased leading to less load of cutting off and less wear experienced by the dicing blade.

The die bond pads and/or the wire bond pads preferably have a plurality of recesses provided on the side faces thereof.

This is because the contact area between the lead and the sealing resin can also be increased with this structure.

The recesses are preferably provided in such a way as the longitudinal cutting face of the die bond pad or the wire bond pad with the recess crosses either of the recesses.

The die bond pads and/or the wire bond pads preferably have longitudinal cross sections having trapezoidal shape with the top side greater than the bottom side.

Size of the die bond pad in the longitudinal direction is preferably equal to or less than the longitudinal size of the semiconductor element mounted on the die bond pad.

This is because a sufficient distance between the die bond pads and the wire bond pads can be maintained thus preventing the occurrence of solder bridge, even when the semiconductor device is made smaller thus reducing the distance between the die bond pads and the wire bond pads.

The present invention also provides a semiconductor device wherein the semiconductor element and other semiconductor element mounted on the other die bond pads arranged in a longitudinal array with the die bond pads, whereon the semiconductor elements are mounted, described above are molded together by means of the sealing resin.

This is because, by molding the plurality of semiconductor elements together as described above, the semiconductor device can be made smaller.

As will be clear from the above description, according to the method of producing the semiconductor element of the present invention, because it is not necessary to prepare lead frames suitable for the individual semiconductor elements to be mounted thereon and the lead frame can be used in common, the production process can be simplified and the production cost can be reduced.

Also because the lead frame with the semiconductor elements mounted thereon is sealed with the resin as a whole, it is not necessary to prepare different molding dies for various sizes of the semiconductor devices, thus the production process can be simplified and the production cost can be reduced.

Particularly because the lead frame with the semiconductor elements mounted thereon consecutively is cut off to make the semiconductor devices in the mass production, there is no part of the lead frame 6 wasted, so that product yield per unit area of the lead frame 6 is improved and the production cost can be reduced.

Also as the lead is provided with the recess, bonding strength with the sealing resin applied thereon or with the mother board can be increased thereby improving the reliability of the semiconductor device.

Also it is made possible to decrease the cut face area of the lead 1, reduce the load applied to the semiconductor device during cutting off and reduce the wear of the dicing blade.

Even when the distance between the die bond pad and the wire bond pad decreases as the size of the semiconductor device is made smaller, the distance therebetween can be maintained to a sufficient level, thereby preventing solder bridge from being formed.

Also in the semiconductor device of the present invention, only the front surface of the semiconductor device is sealed with the resin while the die bond pad and the wire bond pad formed on the back surface by cutting off the leads are exposed, the semiconductor device can be connected directly onto the mother board by using the back surface of the semiconductor device, thus making it possible to reduce the mounting area and height, thereby contributing to the reduction of size and weight.

Also because the die bond pad and the wire bond pad are connected directly to the mother board, heat dissipation from the semiconductor element can be improved, and the present invention can be applied to high-output power elements which generate much heat.

Also because the distance of connecting the mother board and the semiconductor element can be reduced, good high-frequency characteristics can be obtained when high-frequency element is used for the semiconductor element.

Also the bonding area for fastening the semiconductor device onto the mother board with solder or the like by using the die bond pads and the wire bond pads increases, thus making it possible to increase the bonding strength.

BRIEF DESCRIPTION OF THE DRAWINGS

FIGS. 1A–1C show a semiconductor device according to the first embodiment of the present invention.

FIG. 9 shows a production flow chart of the semiconductor device according to the fourth embodiment of the present invention.

FIGS. 19A–19C show another semiconductor device with the configuration of the prior art.

PREFERRED EMBODIMENTS OF THE INVENTION

Embodiment 1

Figure 2A:
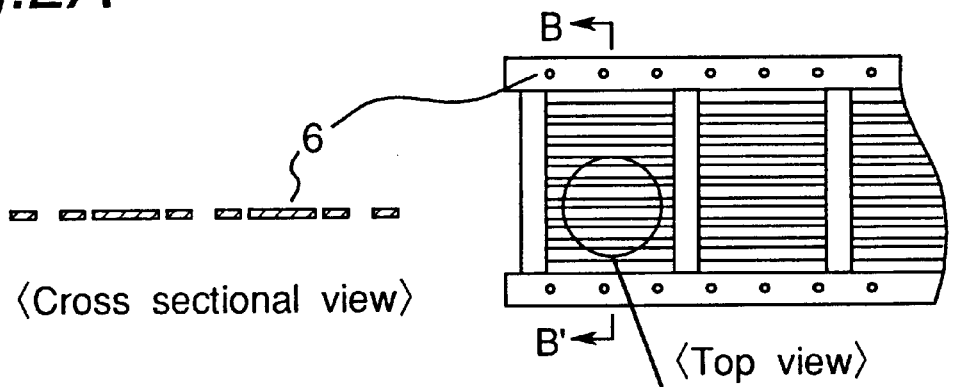
FIGS. 2A–2C show a production flow chart of the semiconductor device according to the first embodiment of the present invention.
Figure 2B:
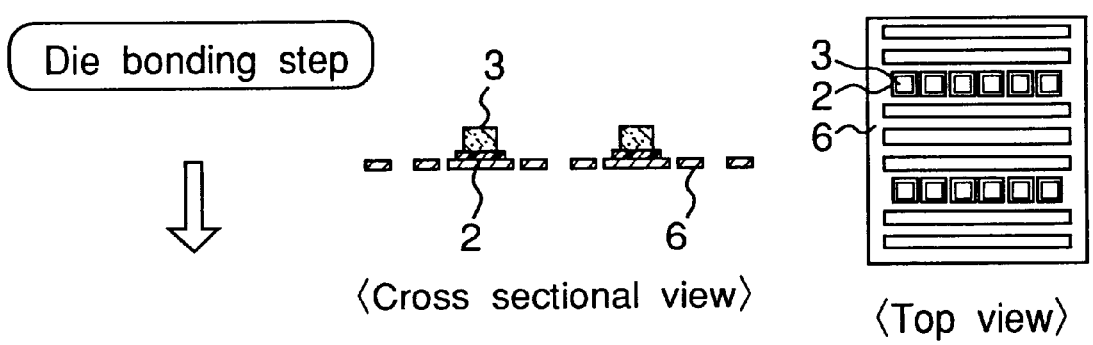

First embodiment of the present invention will now be described below with reference to FIG. 1A through FIG. 3D.

FIGS. 1A–1C show a semiconductor device according to the present invention, with FIG. 1A showing a cross sectional view taken along lines A–A', FIG. 1B showing a top view and FIG. 1C showing a bottom view. In the drawing, numeral 1 denotes an external electrode (wire bond pad), 2 denotes a die bonding material, 3 denotes a semiconductor element, 4 denotes a wire such as gold wire and 5 denotes sealing resin.

A method of producing the semiconductor device shown in FIGS. 1A–1C will be described below with reference to FIGS. 2A–3D.

First, such a lead frame 6 is prepared as shown in FIG. 2A where a plurality of leads are arranged parallel to each other at intervals. The lead frame 6 is shown in FIG. 2A as a top view on the right and cross sectional view taken along lines B–B' on the left. FIGS. 2A–3D show the top view on the right and cross sectional view of that portion taken along lines B–B' on the left. The lead frame 6 is preferably made of copper, 4-2 alloy or the like, Then as shown in the die bonding step of FIG. 2B, a plurality of the semiconductor elements 3 are bonded onto the lead frame 6 by means of a die bonding material 2 such as epoxy resin.

Figure 2C:
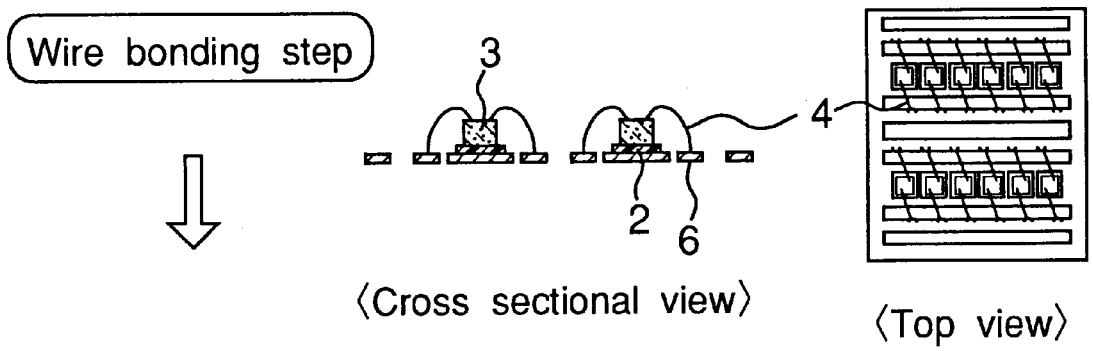

Then as shown in the wire bonding step of FIG. 2C, electrodes (not shown) of the individual semiconductor elements 3 and the lead frame 6 adjacent to the lead frame whereon the semiconductor elements 3 are bonded are connected by means of the wire 4 such as gold wire, thereby making the wiring.

Figure 3A:
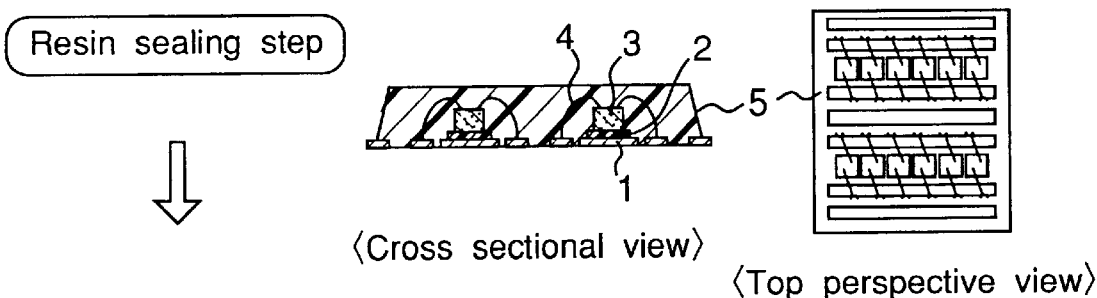
FIGS. 3A–3C show a production flow chart of the semiconductor device according to the first embodiment of the present invention.

Then as shown in the resin sealing step of FIG. 3A, one side of the lead frame 6 whereon the plurality of semiconductor elements 3 are mounted and wired is sealed with the sealing resin 5 such as thermosetting epoxy resin. In this step, all of the plurality of semiconductor elements 3 are sealed together by using a single molding die, instead of sealing the individual semiconductor elements 3 by using different molding dies.

Figure 3B:
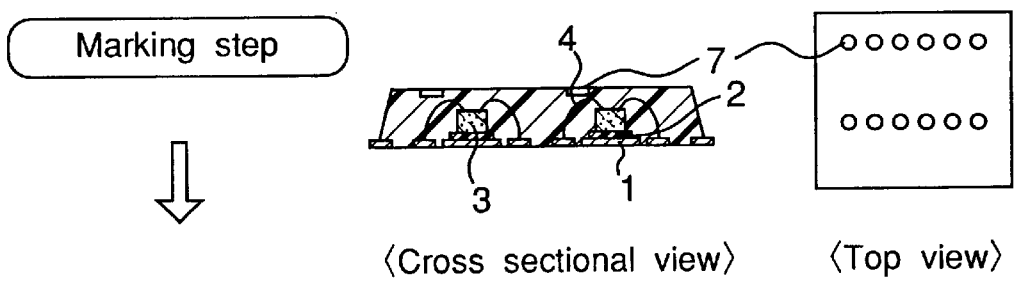

Then as shown in the marking step of FIG. 3B, a marking 7 is made at a predetermined position of the sealing resin 5 by using laser or the like. The marking is made by changing the property of the predetermined portion of the sealing resin 5 by using, for example, YAG laser.

Figure 3C:
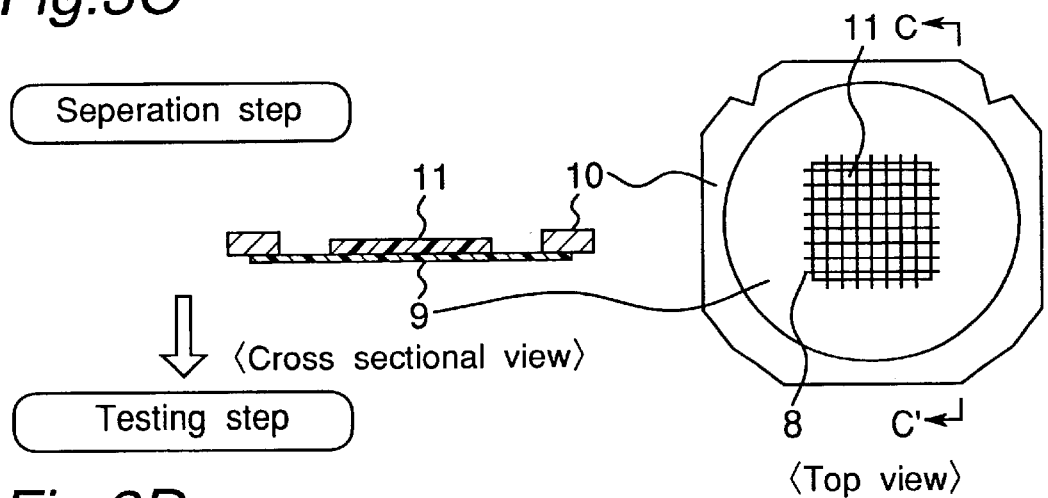

Then as shown in the separation step of FIG. 3C, the semiconductor elements 11 sealed with the same sealing resin 5 are separated to make the individual semiconductor devices. Separation of the semiconductor devices is carried out by means of a dicing apparatus.

In this step, the semiconductor elements which have been sealed with the resin are attached onto an adhesive tape 9 such as vinyl chloride which is fixed onto a securing frame 10. This prevents the semiconductor devices from going to pieces when separated.

Then the semiconductor elements are separated by cutting along a cutting line 8 by means of the dicing apparatus (not shown). In the dicing step, the leads of the lead frame 6 are cut off at the same time the sealing resin 5 is cut off. Thus the lead whereon the semiconductor element 3 is bonded becomes the die bond pad and the lead connected to the semiconductor element 3 with the wire 4 becomes the wire bond pad. The semiconductor devices which have been separated are tested electrically characteristics while being attached onto the adhesive tape 9.

The semiconductor devices are completed when detached from the adhesive tape 9.

The semiconductor devices may also be tested for electric characteristics after being removed from the adhesive tape 9.

Figure 3D:
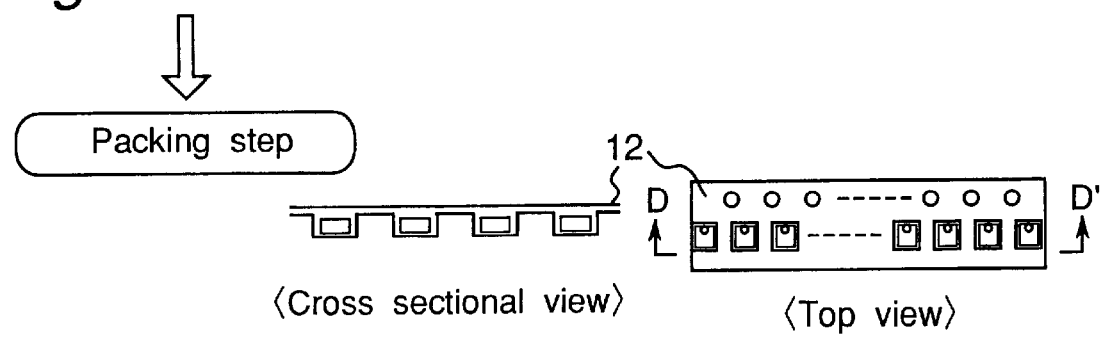

Last, as shown in packaging step of FIG. 3D, the semiconductor devices are placed on an embossed tape 12 made of paper or the like or a tray and packaged, to be ready for shipment as products.

As described above, the semiconductor devices of this embodiment are sealed with the resin only on the top surface thereof, while the die bond pads and the wire bond pads formed on the back surface by cutting off the leads are exposed.

Figure 12A:
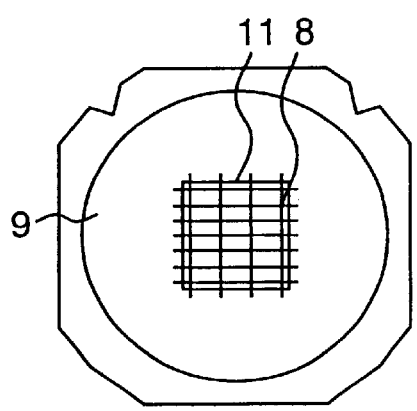
FIGS. 12A–12C show a production flow chart of the semiconductor device according to the seventh embodiment of the present invention.
Figure 12B:
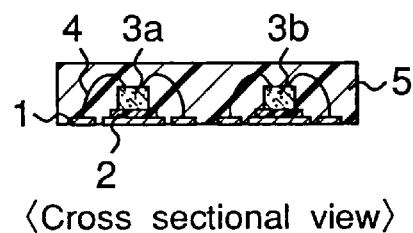
Figure 12C:
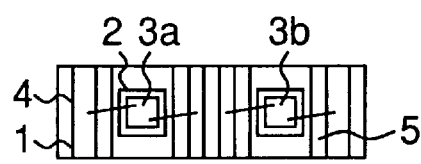

Therefore, the semiconductor devices of this embodiment are connected directly to the mother board by using the back surface of the semiconductor device, not by using the outer lead 1b as in the case of the semiconductor device of the prior art shown in FIGS. 12A–12C, thus making it possible to reduce the semiconductor device smaller in the mounting area and height thereby contributing to the reduction of size and weight.

Also because the die bond pads and the wire bond pads are connected directly to the mother board, heat dissipation from the semiconductor element is improved better than that with the configuration of the prior art. Thus, stable operation can be achieved even when a high output power element generating greater heat is used for the semiconductor element.

Also because connecting distance between the mother board and the semiconductor element 3 can be made shorter than that of the conventional configuration shown in FIGS. 12A–12C where connection to the mother board is made by using the inner lead 1a and the outer lead 1b, and it is made possible to obtain good high-frequency characteristic even when a high-frequency element is used for the semiconductor element.

Also because connection area of the sealing resin 5 with the die bond pad and the wire bond pad is made greater than that of the semiconductor device of the prior art shown in FIGS. 12A–12C, it becomes possible to prevent the sealing resin 5 from peeling off the die bond pad and other portions due to thermal stress occurring thereon or other causes, and reliability of the semiconductor device can be improved.

Also the bonding area for fastening the semiconductor device onto the mother board with solder or the like by using the die bond pads and the wire bond pads becomes greater, thus making it possible to increase the bonding strength.

Figure 20A:
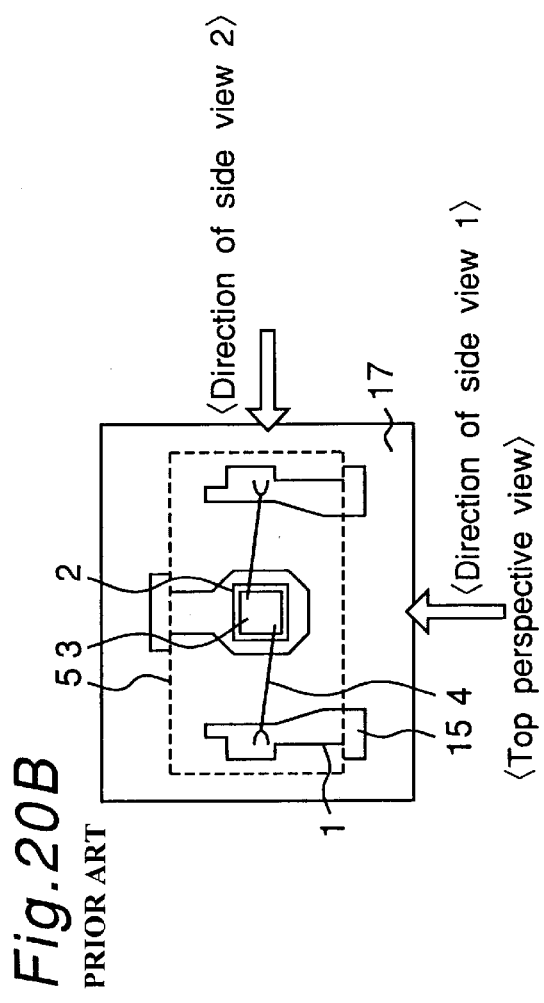
FIGS. 20A–20D show a production flow chart of another semiconductor device with the configuration of the prior art.
Figure 20B:
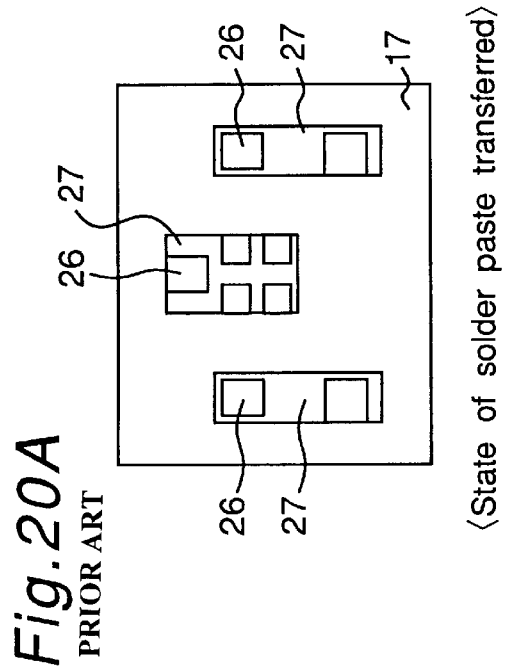
Figure 20C:
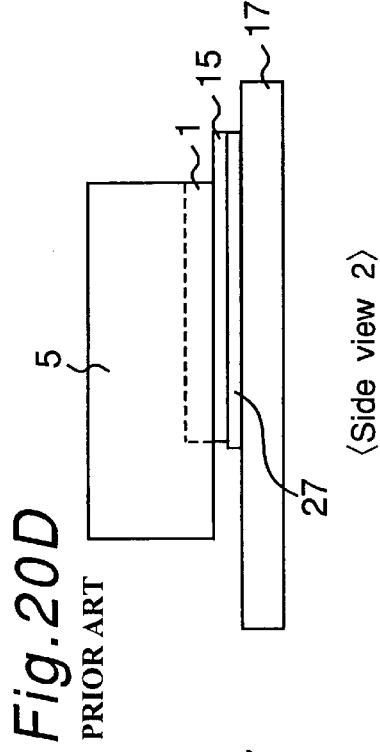
Figure 20D:
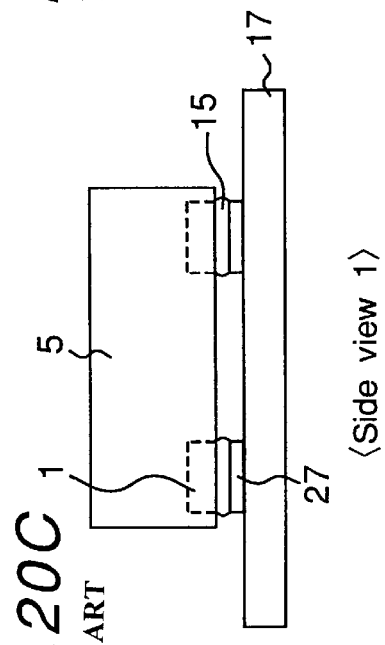

When the semiconductor device is bonded onto the mother board 17 as shown in FIG. 20A, in particular, the semiconductor device is bonded onto the electrode pad 27 by transferring a solder paste 26 onto the electrode pad 27 located on the mother board 17, placing the semiconductor device on the electrode pad 27 and melting the solder paste 26 into a solder patch 15 in a reflow step. In this step, in order to prevent a solder bridge from being formed between the electrode pads 27, transfer points of solder paste are generally kept as far from each other as possible.

Figure 8B:
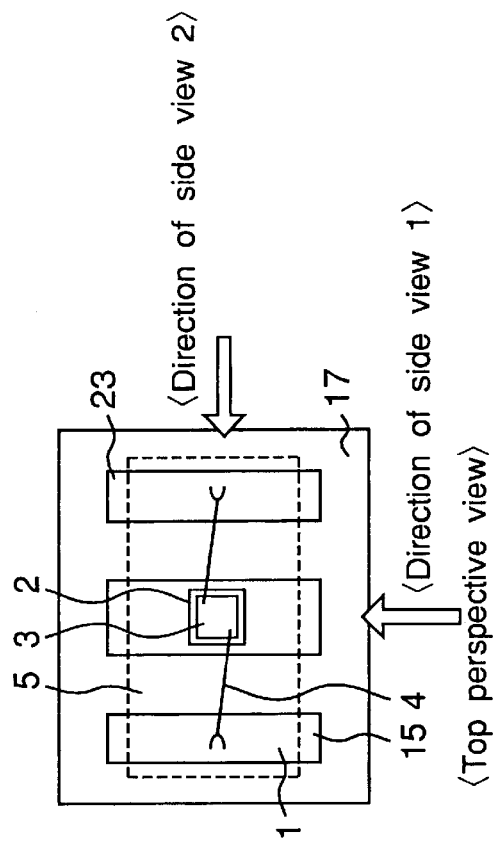
FIGS. 8A–8D show the semiconductor device according to the third embodiment of the present invention.
Figure 8D:
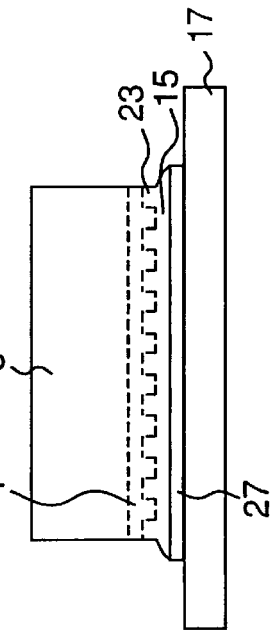
Figure 8A:
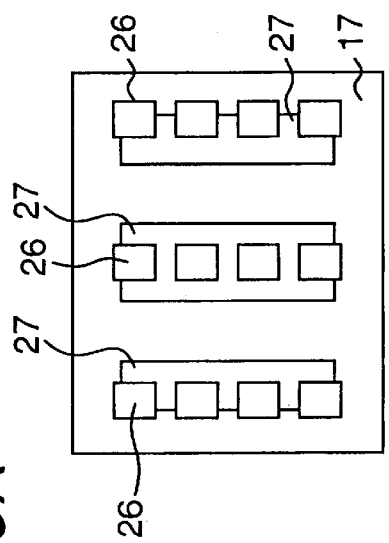
Figure 8C:
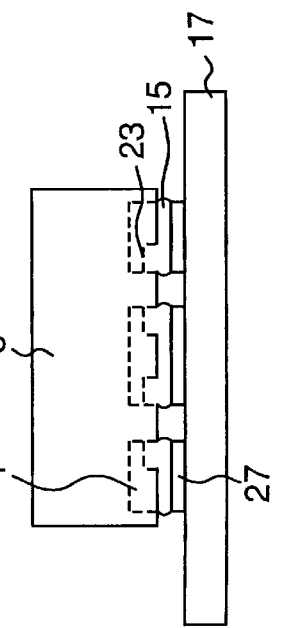

For this reason, because the semiconductor device of this embodiment has the die bond pads and the wire bond pads of larger areas, distance between patches of the solder paste 26 (distance between the solder paste 26 transferred onto the die bond pad and the solder paste 26 transferred onto the wire bond pad) can be increased by transferring the solder paste 26 to a position outward from the electrode pad 27, for example, as shown in FIG. 8A. Thus it is made possible to prevent a solder bridge from being formed between the electrode pads 27, and improve the product yield.

Also according to the method of producing the semiconductor device of this embodiment, a plurality of the semiconductor elements are mounted on the lead frame 6 having the leads arranged parallel to each other and, after sealing with the resin, cut into the individual semiconductor devices.

Figure 17:
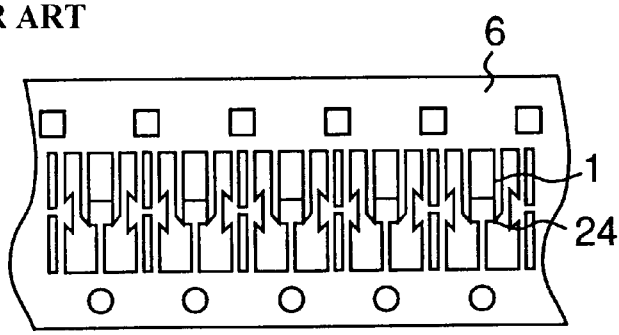
FIG. 17 shows a lead frame used in the production of the semiconductor device with the configuration of the prior art.
Figure 18:
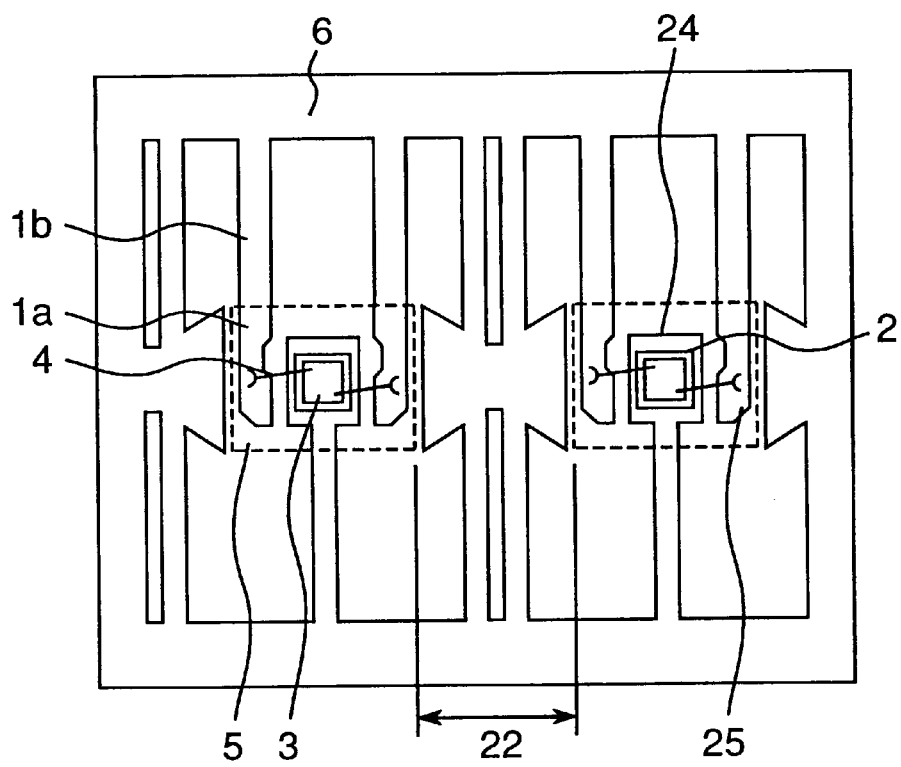
FIG. 18 shows a production flowchart of the semiconductor device with the configuration of the prior art.

Consequently, the lead frame 6 can be used in common thus making it possible to simplify the production process and reduce the production cost, compared to the method of the prior art where the lead frames 6 having the islands 24 designed for the semiconductor elements to be mounted as shown in FIG. 17 are prepared.

Also because the lead frame whereon the semiconductor elements 3 are mounted is sealed with the resin as a whole at the same time, it is not necessary to prepare different molding dies for resin sealing of different semiconductor devices as in the case of the prior art where the semiconductor devices are sealed with resin individually, thus making it possible to reduce the production cost.

Also the shape of the semiconductor device can be changed easily by changing the dicing position, thus readily allowing for changes in the design of the semiconductor device.

In mass production, in particular, because the semiconductor devices are made by cutting off the lead frame 6 whereon the semiconductor elements are mounted consecutively as shown in FIG. 3A, there is no part of the lead frame 6 to be wasted, so that product yield per unit area of the lead frame 6 is improved and the production cost can be reduced.

Japanese Unexamined Patent Publication No.62-134945, for example, discloses a molded transistor shown in FIGS. 19B, 19C which is sealed with a resin by using a molding die for each semiconductor device on the lead frame 6 (FIG. 19A) matched to the semiconductor element 3, and therefore this method is different from that of the present invention.

The semiconductor device having the configuration according to this embodiment as shown in FIG. 1 is different from the semiconductor device of the prior art shown in FIGS. 19A–19C, in that the die bond pads and the wire bond pads are provided to lie across both side faces of the semiconductor device in the direction perpendicular to the lead. That is, in the case of the semiconductor device shown in FIGS. 19A–19C, it is not intended to improve the heat dissipation performance unlike the semiconductor device of this embodiment which aims to improve the heat dissipation performance and improve the strength of bonding onto the mother board by increasing the areas of the die bond pads and the wire bond pads.

Embodiment 2

A semiconductor device of another embodiment of the present invention will be described below with reference to FIGS. 4A–6B.

Figure 4A:
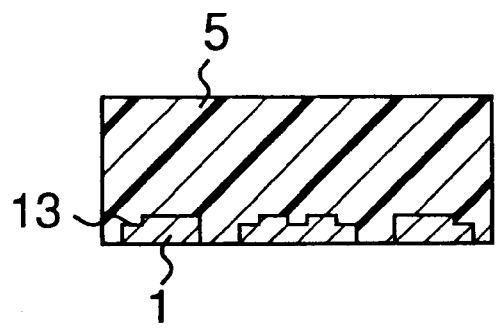
FIGS. 4A and 4B show a semiconductor device according to the second embodiment of the present invention.
Figure 4B:
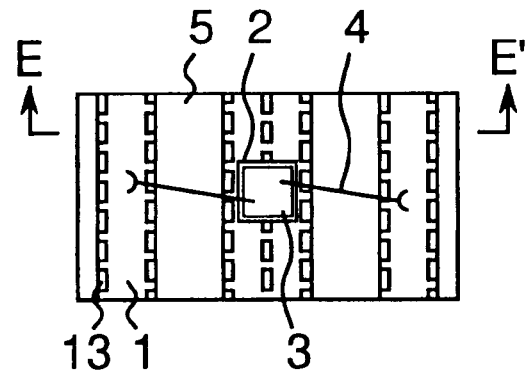

FIGS. 4A and 4B show the semiconductor device having a plurality of recesses on the top surface of the lead, with a top view (perspective view) on the right (FIG. 4A) and a cross sectional view of the portion taken along lines E–E' on the left (FIG. 4B). In the drawing, the same reference numerals as those in FIGS. 1A–1C denote the identical or corresponding parts. FIGS. 4A and 4B show such a structure that is cut off through a recess provided on the top surface of the lead 1 wherever dicing is done.

Figure 5A:
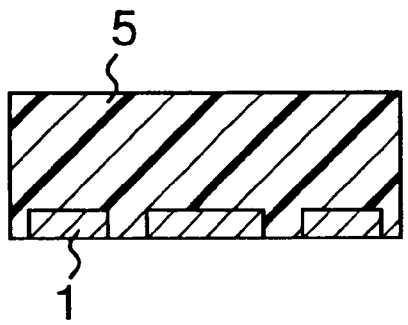
FIGS. 5A and 5B show the semiconductor device according to the second embodiment of the present invention.
Figure 5B:
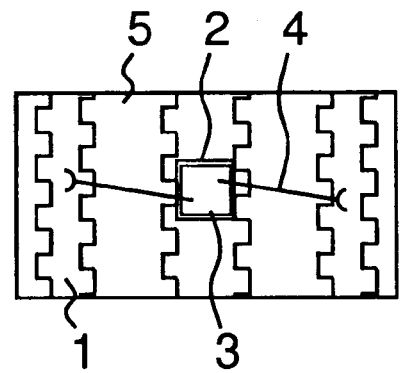

FIG. 5A and 5B show the semiconductor device having uneven surface made on the side of the lead, with a top view (perspective view) on the right (FIG. 5A) and a cross sectional view of the portion taken along lines E–E' on the left (FIG. 5B). In the drawing, same reference numerals as those in FIGS. 1A–1C denote the identical or corresponding parts. FIGS. 5A and 5B show such a structure that is cut off through a recess provided on the side face of the lead 1 wherever dicing is done.

Figure 6A:
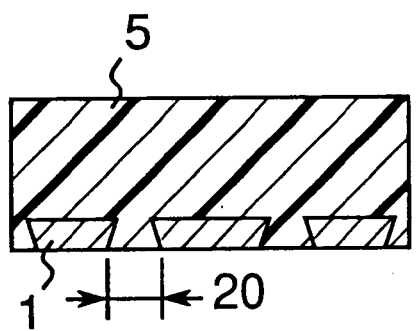
FIGS. 6A and 6B show the semiconductor device according to the second embodiment of the present invention.
Figure 6B:
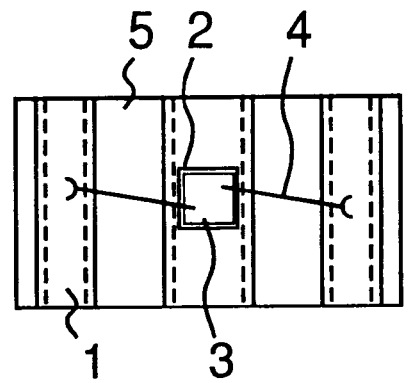

FIGS. 6A and 6B show a semiconductor device having a lead of cross section made in a trapezoidal shape with the top side greater than the bottom side, with a top view (perspective view) on the right (FIG. 6A) and a cross sectional view of the portion taken along lines E–E' on the left (FIG. 6B). In the drawing, same reference numerals as those in FIGS. 1A–1C denote the identical or corresponding parts.

When the lead 1 of this embodiment is used, contact area of the lead 1 and the sealing resin 5 applied thereon becomes larger, resulting in increased bonding strength and improvement in the reliability of the semiconductor device.

This configuration also makes it possible to make the cut face area of the lead 1 smaller than that of the prior art. Therefore, when separating the semiconductor devices by means of the dicing apparatus or the like in the separation step of FIG. 3C, for example, the cut face area of the lead 1 can be decreased with this configuration, leading to less load of cut-off applied to the semiconductor device and less wear of the dicing blade.

In the configuration shown in FIGS. 6A and 6B, in particular, because the distance 20 between the leads 1 can be made greater than that in the case of using the leads with the configuration of the prior art, solder bridge between the leads 1 can be prevented from occurring when soldering the semiconductor device onto the mother board.

Embodiment 3

A semiconductor device of another embodiment of the present invention will be described below with reference to FIGS. 7A–8D.

Figure 7A:
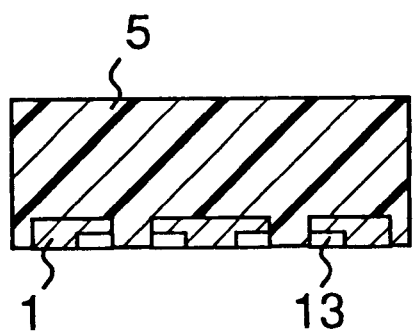
FIGS. 7A and 7B show a semiconductor device according to the third embodiment of the present invention.
Figure 7B:
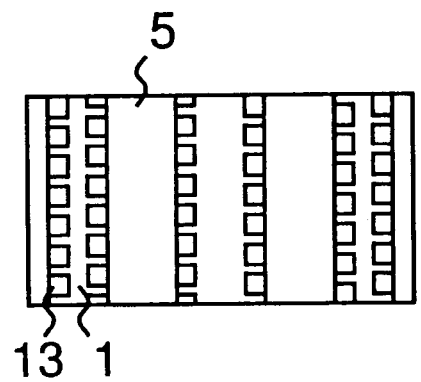

FIGS. 7A and 7B show the semiconductor device having a plurality of recesses formed on the back surface of the lead, with a top view (perspective view) on the right (FIG. 7A) and a cross sectional view of the portion taken along lines E–E' on the left (FIG. 7B). In the drawing, same reference numerals as those in FIGS. 1A–1C denote the identical or corresponding parts. FIG. 7 shows such a structure that is cut off through a recess provided on the back surface of the lead 1 wherever dicing is done.

FIGS. 8A–8D are schematic diagrams showing a case of mounting the semiconductor device of this embodiment on the mother board 17. In the drawing, numeral 26 denotes solder paste which has been transferred, 27 denotes an electrode pad formed on the mother board, 15 denotes a solder patch formed by reflowing of the solder paste and 23 denotes a solder fillet formed on the lead.

When the semiconductor device is bonded onto the electrode pad 27 on the mother board by means of the solder 15 with the recess provided on the back surface of the lead, the solder fillet 23 having good wettability of the solder 15 is provided as shown in FIG. 8A, thus it is made possible to increase the soldering strength.

Also when checking the quality of solder joints by visual inspection, it is easier to discern the condition of the solder 15 connection.

Particularly when copper is used for the lead 1 material, the surface of the lead 1 is plated with gold or the like in order to make it easier to connect the gold wire 4 or the like to the lead 1 surface. As the lead 1 is plated with gold also in the recess thereof, the bonding material such as the solder 15 can easily rise into the recess thereby forming a good fillet of the solder 15 or the like. This makes it possible to bond the semiconductor device onto the mother board strongly.

In this embodiment, too, because the cutting face of the lead passes through the recess, the area of the lead cutting face becomes smaller thus making it possible to obtain the same effect as that of the second embodiment.

Embodiment 4

Another embodiment of the present invention will be described below with reference to FIG. 9.

When sealing the semiconductor device which has been wire-bonded by using the sealing resin 5 in the resin sealing step shown in FIG. 3A of the first embodiment, burrs 14 of resin may occur as the sealing resin 5 seeps to the back surface of the lead 1 due to deformation of the lead or other cause (a).

In this embodiment, a deburring step (b) is provided after the resin sealing step, thereby to remove the useless resin burrs sticking onto the back surface of the lead 1. The resin burrs can be removed by, for example, blasting the lead 1 with a high-speed jet of water carrying glass beads churned therein.

By providing the deburring step after the resin sealing step, sufficient wettability of the solder 15 connecting the mother board 17 and the semiconductor device can be ensured.

Embodiment 5

Another embodiment of the present invention will be described below with reference to FIG. 10.

This embodiment provides a masking step prior to the resin sealing step of FIG. 3A of the first embodiment.

As described in conjunction with the fourth embodiment, there may occur such a problem in the resin sealing step as the sealing resin seeps to the back surface of the lead 1 resulting in soldering failure.

Figure 10:
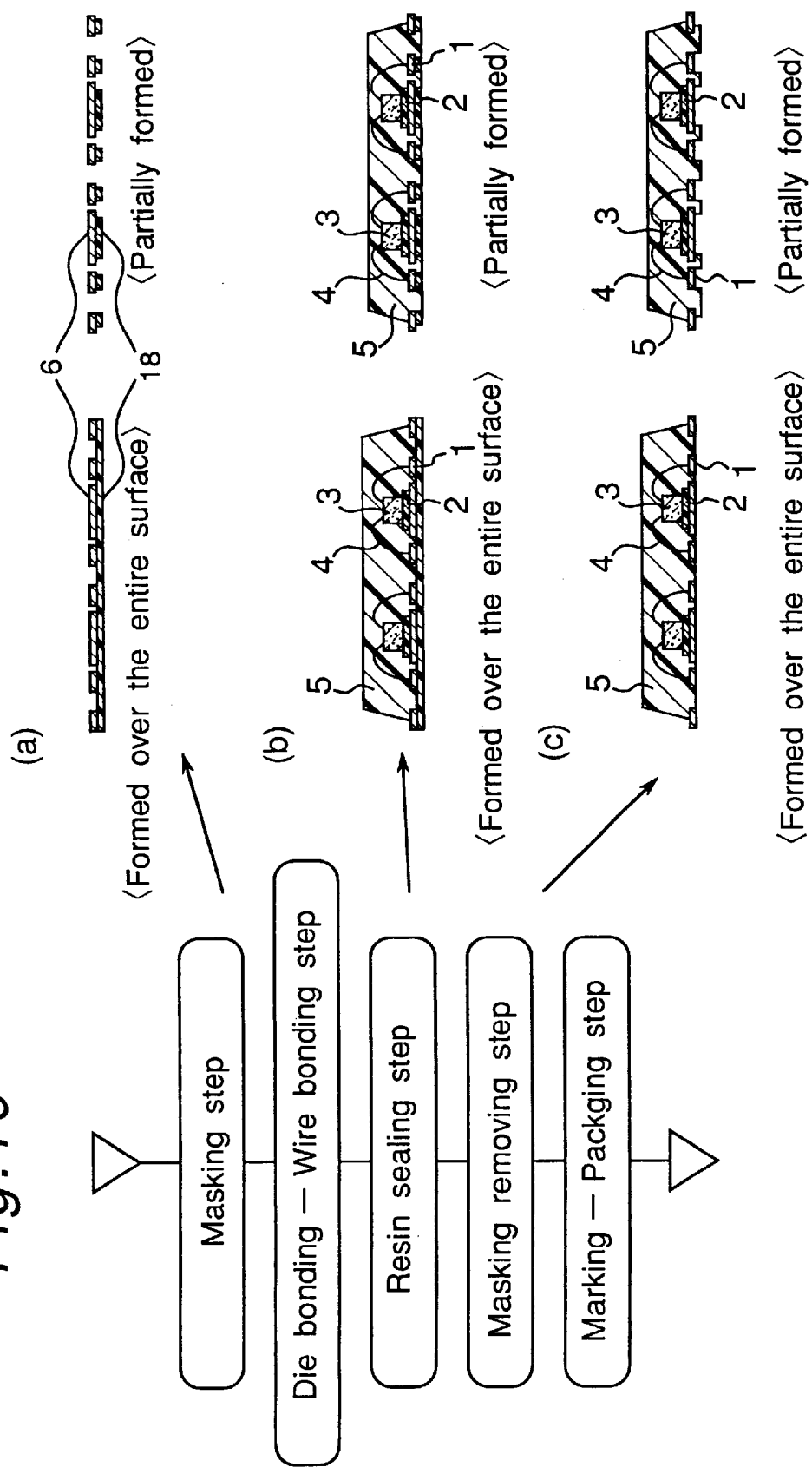
FIG. 10 shows a production flow chart of the semiconductor device according to the fifth embodiment of the present invention.
Figure 14A:
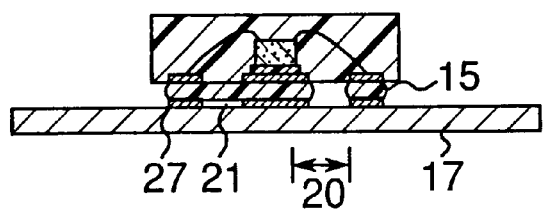
FIGS. 14A–14B show a production flow chart of the semiconductor device according to the eighth embodiment of the present invention.
Figure 14B:
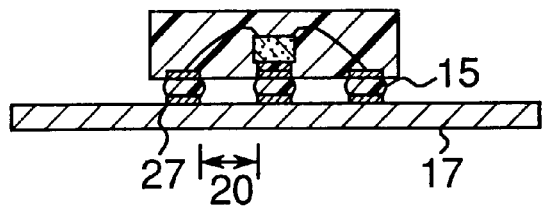
Figure 15A:
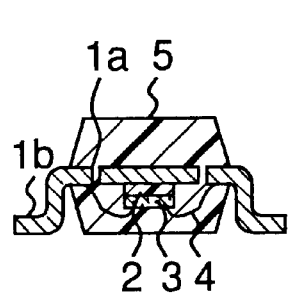
FIGS. 15A and 15B show a semiconductor device with the configuration of prior art.
Figure 15B:
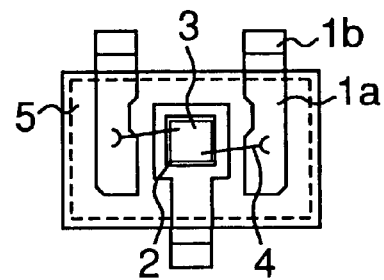
Figure 16:
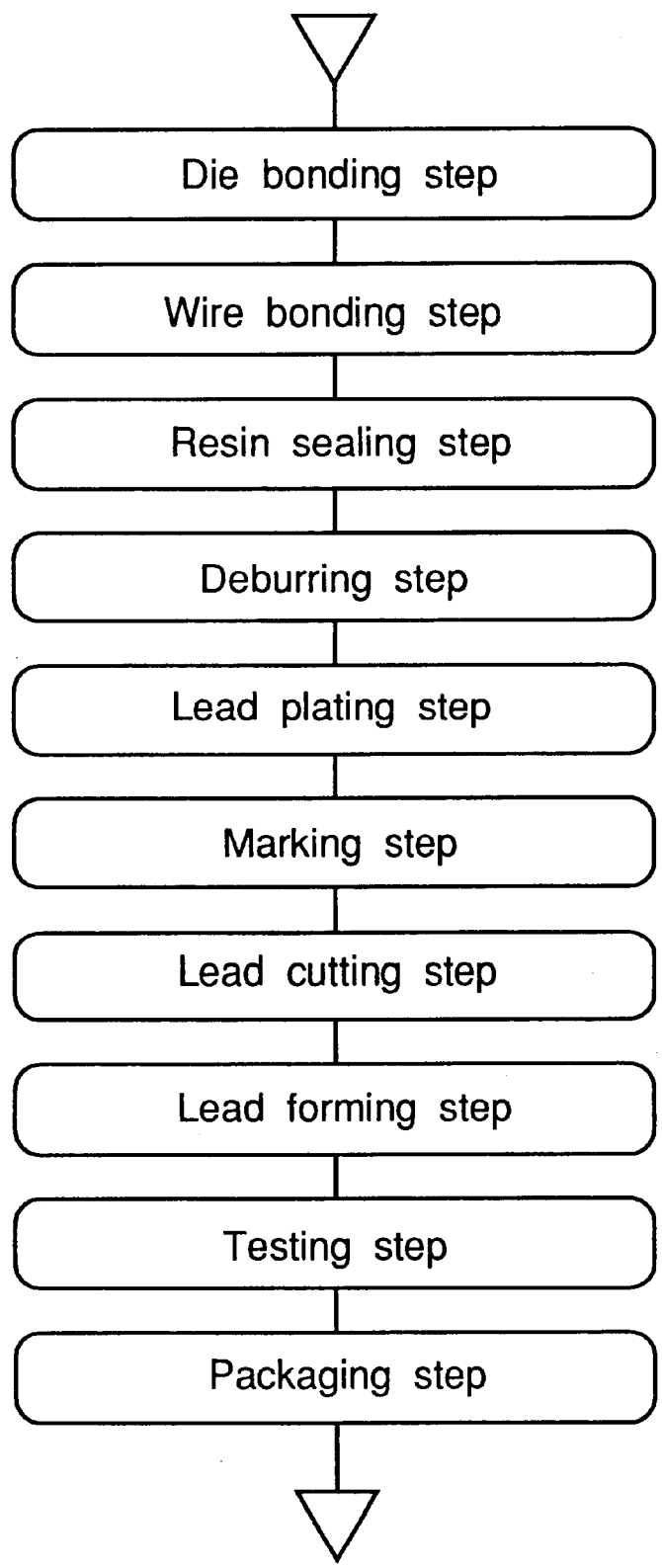
FIG. 16 shows a production flow chart of the semiconductor device with the configuration of the prior art.

In this embodiment, as shown in (a) of FIG. 10, a masking material 18 is applied to the entire back surface (middle of FIG. 10) or a part (right side of FIG. 10) of the lead 1 prior to the resin sealing step (state after forming the mask is shown in FIGS. 14A, 14B), thereby preventing the resin from seeping to the back of the lead during resin sealing.

This makes it possible to protect the back surface of the lead 1 and prevent connection failure between the semiconductor device and the mother board from occurring.

Polyimide tape or the like is used for the masking material 18, which is removed by peeling off or dissolving after the resin sealing step (c).

In case the masking material 18 is applied partially as shown in the right-hand side of FIG. 10, the sealing resin 5 partially seeps to the back of the lead 1 in the resin sealing step, thereby to wrap the lead 1, thus improving the adhesion of the sealing resin 5 and the lead 1 and making it possible to improve the reliability.

Embodiment 6

Figure 11:
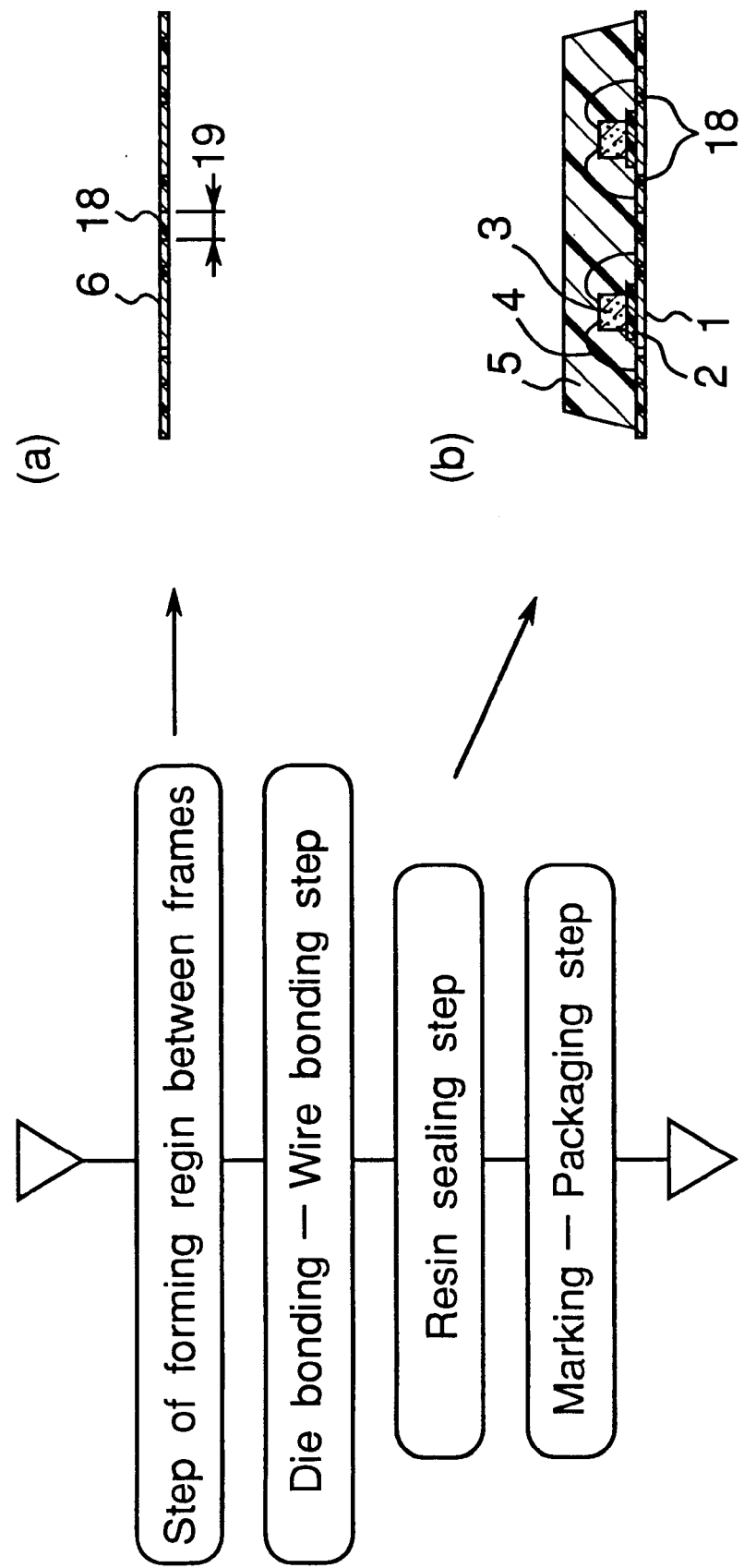
FIG. 11 shows a production flow chart of the semiconductor device according to the sixth embodiment of the present invention.

Another embodiment of the present invention will be described below with reference to FIG. 11.

This embodiment provides a resin forming step prior to the resin sealing step of FIG. 3A of the first embodiment.

As shown in FIG. 11A, the masking material 18 such as acrylic resin or epoxy resin is applied beforehand in a space 19 between the leads 1 by printing or the like.

By providing such a step, it becomes possible to prevent the resin from seeping through the space 19 between the leads 1 in the resin sealing step as shown in FIG. 11B, thereby to prevent the resin from seeping to the back of the lead 1.

Embodiment 7

Another embodiment of the present invention will be described below with reference to FIGS. 12A–12C.

In this embodiment, dicing position in the separation step of FIG. 3C is changed in order to obtain a semiconductor device having a plurality of semiconductor elements 3a, 3b sealed together by the sealing resin 15 (FIGS. 12A–12C).

Consequently, because the dicing position in the direction parallel to the lead 1 can be freely selected since this is not accompanied by cutting off the lead frame 6, setting the dicing position around a plurality of semiconductor elements 3 makes it possible to produce a semiconductor device having a plurality of semiconductor elements 3 arranged in an array as shown in FIGS. 12A–12C.

In this case, the number of the semiconductor elements 3 can be set according to the design and it is also made possible to produce the semiconductor device having different kinds of semiconductor elements 3 mounted thereon.

Embodiment 8

Another embodiment of the present invention will be described below with reference to FIGS. 13A–13C.

In case the leads 1 are separated by a small space 20, a bridge 21 may occur as shown in FIG. 14A when the semiconductor device is connected to the mother board 17, resulting in connection failure.

Figure 13A:
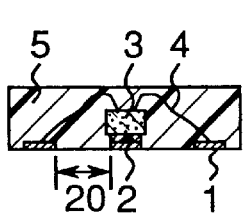
FIGS. 13A–13C show a production flow chart of the semiconductor device according to the eighth embodiment of the present invention.
Figure 13B:
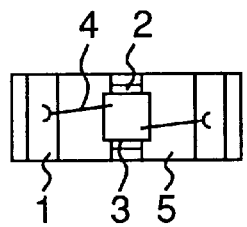
Figure 13C:
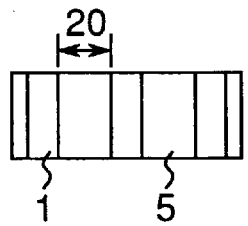

In the semiconductor device of this embodiment, by setting the width (horizontal direction in FIGS. 14A, 14B) of the lead 1 (die bond pad), whereon the semiconductor element 3 is bonded, equal to or less than the width of the semiconductor element 3, it is made possible to make the distance 20 of the leads 1 sufficiently larger, thereby preventing connection failure from occurring (FIGS. 13A–13C).

What is claimed is:

1. A method of producing a semiconductor device comprising a die bond pad, a wire bond pad, a semiconductor element mounted on the die bond pad, and a sealing resin for molding the semiconductor element, which comprises preparing a lead frame having a plurality of leads disposed substantially in parallel to each other at intervals in the longitudinal direction in the same plane; bonding a plurality of semiconductor elements in parallel on at least one lead surface of the lead frame; electrically connecting an electrode of each semiconductor element and another lead adjacent therewith in the longitudinal direction; molding the plurality of semiconductor elements together by means of the sealing resin applied from above the lead surface so that the back side of the lead is exposed; and cutting the lead and the sealing resin in the longitudinal direction between the semiconductor elements, thereby to take the lead with the semiconductor element being mounted thereon as a die bond pad, and to take the lead connected to the electrode of the semiconductor element as a wire bond pad.

2. The method as claimed in claim 1, wherein the back surface of the lead is covered with a resin sheet thereby to mold with the sealing resin.

3. The method as claimed in claim 1, wherein the space between the leads is filled with a masking material before applying the sealing resin.

4. The method as claimed in claim 1, wherein the sealing resin which has seeped to the back surface of the lead is removed after applying the sealing resin.

5. The method as claimed in claim 1, wherein the size of the lead in the longitudinal direction whereon the semiconductor element is mounted is equal to or less than the size of the semiconductor element in the longitudinal direction.

6. The method as claimed in claim 1, wherein the semiconductor element is bonded on the lead surface by means of an electrically conductive or insulating adhesive.

7. The method as claimed in claim 1, wherein the sealing resin is cut off outside a plurality of semiconductor elements so that the plurality of semiconductor elements bonded on the different leads which are arranged in a direction perpendicular to the leads are molded in the same sealing resin.

* * * * *